United States Patent [19]
Thio

[11] Patent Number: 5,804,842
[45] Date of Patent: Sep. 8, 1998

[54] OPTICALLY WRITING ERASABLE CONDUCTIVE PATTERNS AT A BANDGAP-ENGINEERED HETEROJUNCTION

[75] Inventor: Tineke Thio, Princeton, N.J.

[73] Assignee: NEC Research Institute, Inc., Princeton, N.J.

[21] Appl. No.: 493,181

[22] Filed: Jun. 20, 1995

[51] Int. Cl.[6] .................................................. H01L 21/20
[52] U.S. Cl. .............................. 257/184; 257/78; 257/434
[58] Field of Search .................................. 257/200, 439, 257/608, 78, 609, 184, 194

[56] References Cited

U.S. PATENT DOCUMENTS

| | | | |
|---|---|---|---|
| 3,745,429 | 7/1973 | Fujishiro | 257/439 |
| 3,924,150 | 12/1975 | Wasa et al. | 257/200 |
| 3,927,385 | 12/1975 | Pratt, Jr. | 257/200 |
| 4,958,203 | 9/1990 | Takikawa | 257/194 |
| 5,192,419 | 3/1993 | Matsuura et al. | 205/244 |
| 5,285,081 | 2/1994 | Ando | 257/24 |
| 5,404,027 | 4/1995 | Haase et al. | 257/200 |
| 5,585,306 | 12/1996 | Miyazawa | 437/129 |

FOREIGN PATENT DOCUMENTS 62-266873  11/1987  Japan ...................................... 257/194

OTHER PUBLICATIONS

Crowder et al., "Silicon Schottky Barrier Bistable Memory Element", *IBM Technical Disclosure Bulletin*, vol. 15, No. 3, Aug. 1972, p. 891.

*Primary Examiner*—Donald Monin
*Attorney, Agent, or Firm*—Philip J. Feig; Arthur J. Torsiglieri

[57] ABSTRACT

A heterojunction is formed between a pair of layers of different semiconductive materials whose work function difference produces a large band offset at the heterojunction. Donor or acceptor atoms are included in one regions that when photoexcited produce free charge carriers but leave behind charged centers that keep the photoexcited carriers localized. The large barrier at the heterojunction limits recombination of the free charge carriers and the charged centers and persistent photoconductivity results. This effect is used to form light operated switches. An illustrative example uses a layer of high purity gallium arsenide forming a heterojunction with a gallium-doped layer of zinc selenide.

22 Claims, 4 Drawing Sheets

OPTICALLY WRITING ERASABLE CONDUCTIVE PATTERNS AT A BANDGAP-ENGINEERED HETEROJUNCTION

FIELD OF THE INVENTION

This invention relates to optoelectronic apparatus and more particularly to such apparatus of the kind that utilizes a doped compound-semiconductive element that is provided with a heterojunction by means of which there can be created a photo-induced metastable state in which the photogenerated carriers are mobile for a relatively long time while the dopant ions remain fixed.

BACKGROUND OF THE INVENTION

Currently there has been growing interest in optoelectronic devices that make use of persistent photoconductivity that can be created in doped semiconductive compounds that contain DX centers. DX centers are formed in a semiconductor when a donor impurity does not form a shallow hydrogen state, but rather a deep, tightly bound state, owing to a large lattice relaxation around the donor ion. In the ground state, the DX center is negatively charged. Optical excitation converts it into a normal shallow donor, with the release, at high enough temperatures or densities, of two electrons into the conduction band. The excited state is metastable, because the structural relaxation required to return to the DX ground state gives rise to a capture barrier $E_{CAP}$. At sufficiently low temperatures, this results in persistent photoconductivity: the electron concentration remains high indefinitely, even after the exciting light source has been removed. Moreover, because of Coulomb forces provided by the ionized donor centers, these free electrons remain confined near the donor centers. An application Ser. No. 08/225,047 filed Apr. 8, 1994, assigned to the same assignee as the instant application describes a variety of optoelectronic apparatus that make use of persistent photoconductivity or persistent photorefractive effects that are associated with DX centers. Unfortunately, however, the ambient temperature that has to be maintained to prevent recapture of the photocarriers in materials presently known to exhibit DX centers is relatively low and room temperature operation is not feasible. This restricts the usefulness of such devices.

SUMMARY OF THE INVENTION

An object of the present invention is semiconductive storage apparatus that, when irradiated by a pattern of light, stores the pattern as a persistent pattern of increased conductivity without the need for the low temperatures needed by the embodiments described in the aforementioned patent application.

In particular, the present invention uses as the storage medium a semiconductive element that includes a special heterojunction between two regions of different semiconductive materials of which one is appropriately doped with a donor that can introduce DX centers. The photocarriers reside at the heterojunction and are spatially removed from the original sites of DX centers. If the heterojunction is designed to provide a large band offset, the latter serves as a high barrier to recombination, since the photocarriers must tunnel through the barrier or be thermally excited over it in order to return to the original DX sites. If the barrier is high enough (of order 1eV), PPC is feasible which persists at room temperature for at least about one year.

As a specific example, the semiconductive element comprises a region of insulating GaAs contiguous with a region of Ga-doped ZnSe to form a heterojunction. The gallium atoms form DX centers in the zinc selenide and, when ionized by photoexcitation, release free electrons. On the gallium arsenide side far from the heterojunction, the Fermi level is in the middle of the band gap because it is undoped. On the gallium-doped zinc selenide side, also far from the interface, the Fermi level is pinned at the level of the deep DX center, when the element is in the dark. This is because in general there is some compensation that depletes a fraction of the DX centers.

On photo-excitation, the gallium ions which are negatively charged undergo a lattice relaxation and release two electrons to the conduction band. These photo-generated electrons will reside at the lowest energy level available, which is at the lowest level of the two dimensional electron gas (2DEG), if it is arranged to lie lower than the bottom of the zinc selenide conduction band after illumination, but higher than the DX level in the dark. However, since the photocarriers have left behind a positively charged gallium ion in the zinc selenide, they will be attracted to the region of photo-excitation by Coulomb interactions and thus be spatially confined to those regions of the 2DEG that lie directly below the illuminated regions of the zinc selenide layer.

As an illustrative example, a normally insulating storage medium of the kind described is provided with a plurality of input terminals and a plurality of output terminals and light is used to create a conductive path through the medium between a selected input terminal and a selected output terminal. This conductive path persists even after the light is extinguished. Moreover, this conductive path is readily erasable for example by thermal annealing, when desired, after which a new conductive path can be formed connecting a different pair of terminals.

The invention will be better understood from the following more detailed description taken in conjunction with the accompanying drawing.

DETAILED DESCRIPTION OF THE INVENTION

Figure 1:
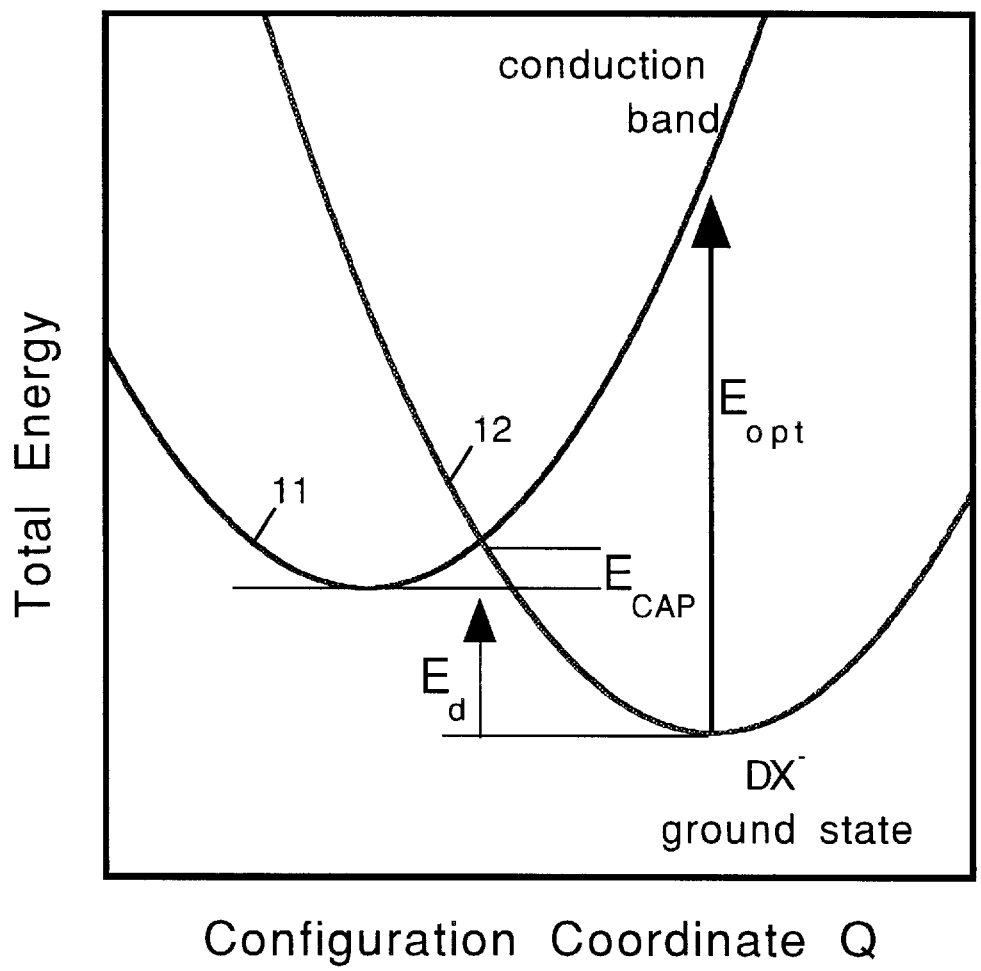
FIG. 1 is an energy diagram of the DX center that will be useful in explaining the basic phenomenon that is important to the invention.

With reference now to the drawing, FIG. 1 shows the total energy of the dopant as a function of the position of the dopant ion. Curve 11 represents the conduction band or the metastable state of the donor atom responsible for the bistable characteristic important to the invention; curve 12 shows the stable DX state of the donor atom that has captured an electron and become negatively charged.

Persistent photoconductivity occurs when electrons trapped in the DX states are ionized by photons of energy equal to or greater than $E_{opt}$ shown in the drawing, and the DX states become ionized shallow donors, which produce a free carrier density, dependent on exposure, up to the original doping density. Recapture of the electrons, which requires thermal excitation over the capture barrier, $E_{CAP}$, does not occur when the temperature is too low for the requisite thermal excitation. In the usual case of DX centers in a bulk semiconductor, the capture barrier ($E_{CAP}$) is small (about 0.3eV), and in order to keep the carrier concentration high after the exciting light source has been removed, the ambient temperature must be kept low, typically below 100K with materials presently known to exhibit DX centers.

In order to achieve room-temperature (300K) operation in the bulk, the intrinsic capture barrier $E_{CAP}$ of the bulk material must be large, i.e. about 1 eV. Alternatively, the recombination time can be made very long by spatially removing the photocarriers from the DX center so that they must tunnel back through a barrier in order to recombine, as in accordance with the present invention. Such a barrier is provided by the heterojunction included in the semiconductive device shown in FIG. 2.

Figure 2:
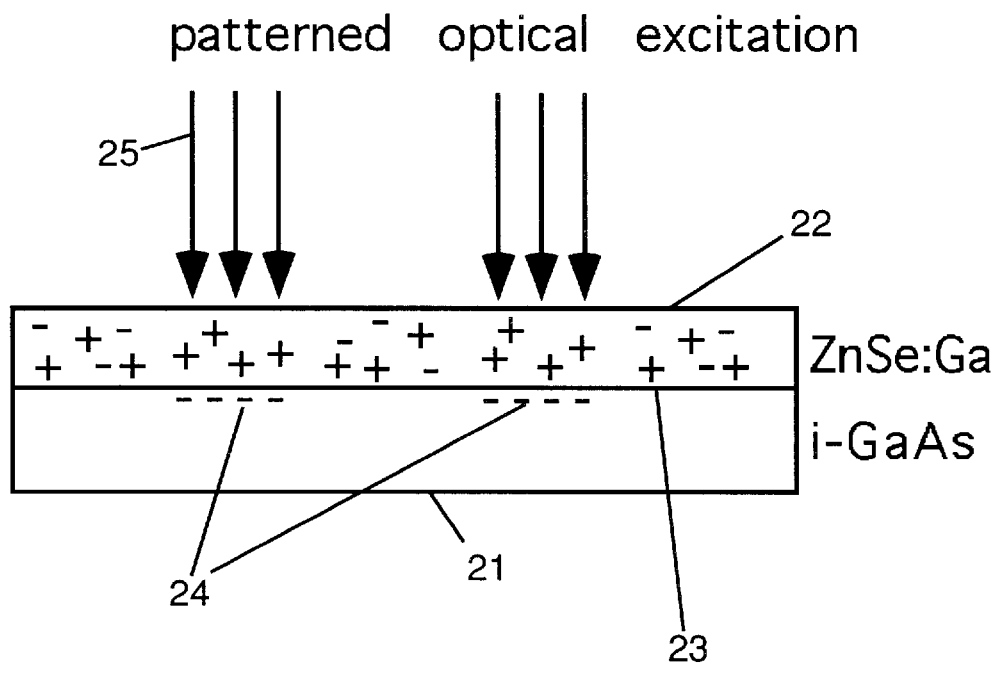
FIG. 2 shows the charge distribution in the semiconductive element of the kind of FIG. 2 after it has been exposed to patterned optical excitation.

The semiconductive device comprises a monolithic structure 20 that includes a substrate 21 of high purity (undoped) insulating gallium arsenide on which has been grown epitaxially, typically by molecular beam epitaxy (MBE), a layer 22 of gallium-doped zinc selenide. Typically the gallium concentration in the zinc selenide layer is about $10^{16}$–$10^{18}$ atoms/cm$^{-3}$. The gallium serves to form DX centers in the zinc selenide according to $2Ga_H \rightarrow Ga^+ + DX^-$, where $Ga_H$ denotes the hydrogenic, shallow donor state, $Ga^+$ a positively charged donor ion, and $DX^-$ the ground state of the DX center, which is negatively charged. Upon photoexcitation, the gallium ions undergo a lattice relaxation with the release of two electrons for each DX center into the conduction band:

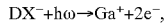

$$DX^- + h\omega \rightarrow Ga^+ + 2e^-,$$

where $h\omega$ is the energy of the exciting photon. Far into the zinc selenide region, the Fermi level is now pinned at the level of the shallow hydrogenic donor (see FIG. 3b). But if the thickness of the ZnSe Layer is matched to the depletion width, then all the photogenerated electrons 24 reside at the 2DEG (the two-dimensional gas), since they tend to occupy the lowest energy available to them. However, since they have left behind in the regions of photoexcitation of layer 22 a positively charged gallium ion, they will be attracted to the underlying regions of the layer 21 by Coulomb interaction. This is illustrated in FIG. 2 which shows a cross section of the heterojunction region 23 under non-uniform illumination indicated by the pattern of light rays 25 shown.

Figure 3A:
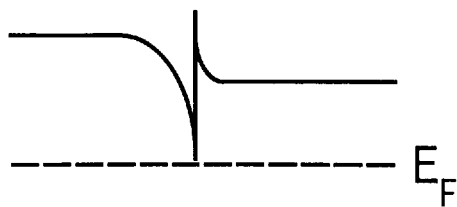
FIGS. 3A and 3B are band diagrams of a semiconductive element of the kind useful in the present invention in the dark and illuminated states, respectively.
Figure 3B:

In FIG. 3, there are shown the band diagrams along with the Fermi level in the regions of interest of the semiconductive element both before (3A) and after (3B) illumination.

Figure 4:
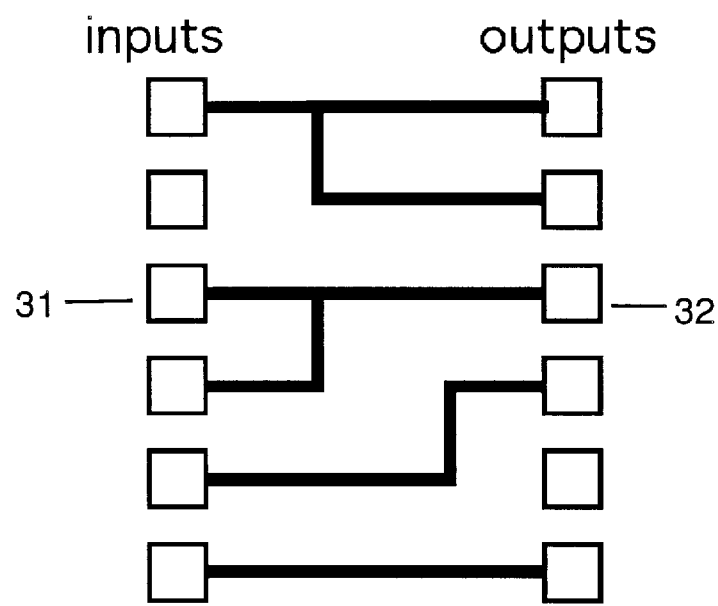
FIG. 4 shows the use of the invention to form a switch for interconnection of selected input and output terminals.

In FIG. 4, there is shown an optically-controlled switch that makes use of the PPC in a semiconductive element of the kind described. It includes a semiconductive element 30 of the kind described which is provided at one edge with a plurality of input terminals 31 and at an opposite edge with a plurality of output terminals 32. An appropriate source of illumination is made to form illuminated paths selectively between one or more input terminals and one or more output terminals to form desired conductive paths therebetween. These conductive path will persist even after the illumination has been discontinued until the conductive paths are erased in any of the ways available for such erasure, such as the thermal excitation of the photoelectrons out of the 2DEG back to the empty sites of the gallium ions.

It is the spatial separation of the excited photoelectrons from the gallium ions from which they were excited that boosts the annealing temperature of the persistent photoconductivity. The photoconductivity persists even at high temperature because the recombination of the photogenerated electrons is now limited to the electrons either tunneling through the barrier or being thermally excited out of the 2DEG back to the empty sites of the gallium ions in the layer 22.

PPC is also found in multiple quantum wells (MQW) in which after photoexcitation the electrons reside in one semiconductor well and the holes reside in the other. However, in such a case both electrons and holes are mobile, and it is not possible to write a persistent pattern of spatially varying conductance. The latter is possible in the structure proposed here since the DX ions are localized.

The choice of the materials forming the heterojunction is important to ensure that such recombination remain small until it is desired to erase the pattern stored. Ideally, in the dark the deep DX level must be well below the lowest 2DEG level and after illumination the lowest 2DEG level must in turn be below the conduction band of the doped semiconductor to capture the photoelectrons. It is also usually important that the two compositions forming the heterojunction be relatively well lattice matched. In some instances it may be advantageous to use a ternary compound as one composition at the heterojunction to facilitate lattice matching.

These two conditions require that the binding energy of the deep DX center must be sufficiently large. In addition, a large band offset, which is a function of the work functions of the two materials forming the heterojunction, is required in order to form a large barrier at the heterojunction and thus to boost the annealing temperature of the bistable state effect responsible for the persistent photoconductivity. In order to achieve an annealing temperature above normal room temperature, a barrier of about 1eV is needed.

One technique for achieving this amount of offset include the use of wide-band gap semiconductors, as in the example described, involving a heterojunction between a III–V semiconductor, such as gallium arsenide, and a wider band gap II–VI semiconductor, such as zinc selenide, whose band gaps are illustrated in FIG. 3. Barriers of order 0.8 eV have been achieved in GaAs-ZnSe heterojunctions. See, for example, R. Nicolini et al, Phys. Rev. Lett., vol. 72, page 294, 1994.

Other combinations that can provide offsets of the size important for near room-temperature operations include InAs/ZnSe, InAs/AlGaAs, Ge/AlGaAs, Ge/CdZnTe, and InP/CdS. In practice, the band offset may be varied considerably by minor departures from stoichiometry in either region in the immediate neighborhood of the heterojunction. For example, in the embodiment shown in FIG. 2, it is advantageous to make the portion of layer 22 selenium-rich to increase the band offset at the heterojunction.

It should also be possible to utilize the phenomenon of AX centers in which holes are made locally mobile by ionization of acceptor centers in an analogous manner to the electrons by donor centers. One example of a material which forms AX centers is Zinc-magnesium sulfide-selenide doped with nitrogren, which has a band gap of about 3 eV. It will be convenient to use the expression "significant impurities" to denote generically materials that act either as donors or acceptors for contributing the DX and AX centers that give rise to the electrons or holes that serve as the free charge carriers responsible for the persistent photoconductivity characteristic of the invention. It will also be convenient to describe such centers generically as bistable centers.

It is to be understood that the specific embodiment described is merely illustrative of possible applications of the invention. Various other embodiments can be devised by a worker in the art without departing from the spirit and scope of the invention.

What is claimed is:

1. A semiconductive device that includes a semiconductive element comprising a first region of a first undoped semiconductive material, and a second region of a second semiconductive material forming a heterojunction with the first region, the second region including donor atoms capable of forming DX centers, the work functions in the two regions being such as to produce at the heterojunction a band offset of at least substantially 1 eV and thus a large barrier to recombination for any free electrons created by photoexcitation of the DX centers.

2. A semiconductive device as set forth in claim 1, which operates at room temperature.

3. A semiconductive device in accordance with claim 1 further characterized in that a two dimensional electron gas is formed in the first region adjacent to the heterojunction with its lowest energy level between the level of the DX centers in the band gap of the second region and the bottom of the conduction band of the second region.

4. A semiconductive device as set forth in claim 3, which operates at room temperature.

5. A semiconductive device in accordance with claim 1 in which the first region is an undoped Group III–Group V compound or Group IV element and the second region is a Group II–Group VI compound doped with donor atoms.

6. A semiconductive device as set forth in claim 5, which operates at room temperature.

7. A semiconductive device in accordance with claim 1 in which the first region is a layer of gallium arsenide and the second region is a layer of gallium-doped zinc selenide.

8. A semiconductive device as set forth in Claim 7, which operates at room temperature.

9. A semiconductive device that includes a semiconductive element comprising first and second regions of different semiconductive materials forming a heterojunction, one of the regions doped with atoms of a significant impurity that is capable of causing bistable centers when photoexcited, the other region being undoped the work functions in the two regions being sufficiently different as to produce at the heterojunction a band offset of at least substantially one electron volt to produce a large barrier to recombination of any free charge carriers created by photoexcitation of the bistable centers.

10. A semiconductive device as set forth in claim 9, which operates at room temperature.

11. A semiconductive device in accordance with claim 9 in which the atoms of the significant impurity serve as donors to create DX centers.

12. A semiconductive device as set forth in claim 11, which operates at room temperature.

13. A semiconductive device in accordance with claim 9 in which the atoms of the significant impurity serve as acceptors to create AX centers.

14. A semiconductive device as set forth in claim 13, which operates at room temperature.

15. A semiconductive device that includes a semiconductive element comprising:

a first region of a first semiconductive material;

a second region of a second semiconductive material forming a heterojunction with said first region, said second region including donor atoms capable of forming DX centers, the work functions of the two regions being such as to produce at the heterojunction a band offset of at least substantially 1eV and thus a barrier to recombination for any free electrons created by photoexcitation of the DC centers;

a plurality of input terminals; and a plurality of output terminals spaced apart from said input terminals on said semiconductive element such that a conductive path may be selectively formed between any one input terminal and any one output terminal by appropriately illuminating said semiconductive element.

16. A semiconductive device as set forth in claim 15, which operates at room temperature.

17. A semiconductive device in accordance with claim 15 further characterized in that a two dimensional electron gas is formed in the first region adjacent to the heterojunction with its lowest energy level between the level of the DX centers in the band gap of the second region and the bottom of the conduction band of the second region.

18. A semiconductive device in accordance with claim 15 in which the first region is an undoped Group III–Group V compound or Group IV element and the second region is a Group II–Group VI compound doped with donor atoms.

19. A semiconductive device in accordance with claim 15 in which the first region is a layer of gallium arsenide and the second region is a layer of gallium-doped zinc selenide.

20. A semiconductive device as set forth in claim 17, which operates at room temperature.

21. A semiconductive device as set forth in claim 18, which operates at room temperature.

22. A semiconductive device as set forth in claim 19, which operates at room temperature.

* * * * *